United States Patent
Fuchida et al.

(10) Patent No.: US 10,063,033 B2
(45) Date of Patent: Aug. 28, 2018

(54) EDGE-EMITTING SEMICONDUCTOR LASER

(71) Applicant: Mitsubishi Electric Corporation, Tokyo (JP)

(72) Inventors: Ayumi Fuchida, Tokyo (JP); Yuichiro Okunuki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/375,198

(22) Filed: Dec. 12, 2016

(65) Prior Publication Data

US 2017/0346256 A1    Nov. 30, 2017

(30) Foreign Application Priority Data

May 31, 2016    (JP) .................... 2016-108916

(51) Int. Cl.
*H01S 5/125*    (2006.01)
*H01S 5/042*    (2006.01)
(Continued)

(52) U.S. Cl.
CPC ............ *H01S 5/125* (2013.01); *H01S 5/0425* (2013.01); *H01S 5/2022* (2013.01);
(Continued)

(58) Field of Classification Search
CPC .... H01S 5/125; H01S 5/3412; H01S 5/34313; H01S 5/0425; H01S 5/2022;
(Continued)

(56) References Cited

U.S. PATENT DOCUMENTS

| 4,991,179 A * | 2/1991 | Deppe ................. H01S 5/18375 |
| | | 372/108 |
| 2003/0152120 A1* | 8/2003 | Ledentsov .......... H01S 5/18341 |
| | | 372/45.01 |

(Continued)

FOREIGN PATENT DOCUMENTS

| JP | H07-202320 A | 8/1995 |
| JP | 2005-538532 A | 12/2005 |

(Continued)

OTHER PUBLICATIONS

An Office Action; "Notification of Reasons for Refusal," issued by the Japanese Patent Office dated Jul. 3, 2018, which corresponds to Japanese Patent Application No. 2016-108916 and is related to U.S. Appl. No. 15/375,198; with English language translation.

*Primary Examiner* — Xinning Niu
(74) *Attorney, Agent, or Firm* — Studebaker & Brackett PC

(57) ABSTRACT

An edge-emitting semiconductor laser includes: a semiconductor substrate; a first cladding layer having a first refractive index and formed on the semiconductor substrate; an active layer formed on the first cladding layer and having a second refractive index higher than the first refractive index; a Bragg reflector formed on the active layer and in which low-refractive-index layers and high-refractive-index layers each having a thickness larger than λ/4n are alternately laid one on another where λ is an lasing wavelength and n is a refractive index of a medium; a light absorption layer formed on the Bragg reflector and having bandgap energy lower than that of the active layer; and a second cladding layer formed on the light absorption layer and having a third refractive index lower than the second refractive index.

15 Claims, 8 Drawing Sheets

(51) Int. Cl.
    *H01S 5/343*       (2006.01)
    *H01S 5/20*        (2006.01)
    *H01S 5/34*        (2006.01)
    *H01S 5/30*        (2006.01)
    *H01S 5/32*        (2006.01)

(52) U.S. Cl.
    CPC ........ H01S 5/2027 (2013.01); H01S 5/34313 (2013.01); *H01S 5/305* (2013.01); *H01S 5/3213* (2013.01); *H01S 5/3412* (2013.01); *H01S 2301/166* (2013.01)

(58) Field of Classification Search
    CPC ...... H01S 5/2027; H01S 5/3213; H01S 5/305; H01S 2301/166
    See application file for complete search history.

(56) References Cited

U.S. PATENT DOCUMENTS

2005/0040410 A1*   2/2005   Ledentsov ............ H01L 33/105
                                                                  257/79
2005/0271113 A1*  12/2005   Song ................... H01S 5/02461
                                                                  372/98

FOREIGN PATENT DOCUMENTS

| JP | 2008-235691 A | 10/2008 | |
| JP | 2009-141032 A | 6/2009 | |
| JP | 2012-104764 | * 12/2010 | ............ H01L 33/10 |
| JP | 2012-104764 A | 5/2012 | |

* cited by examiner

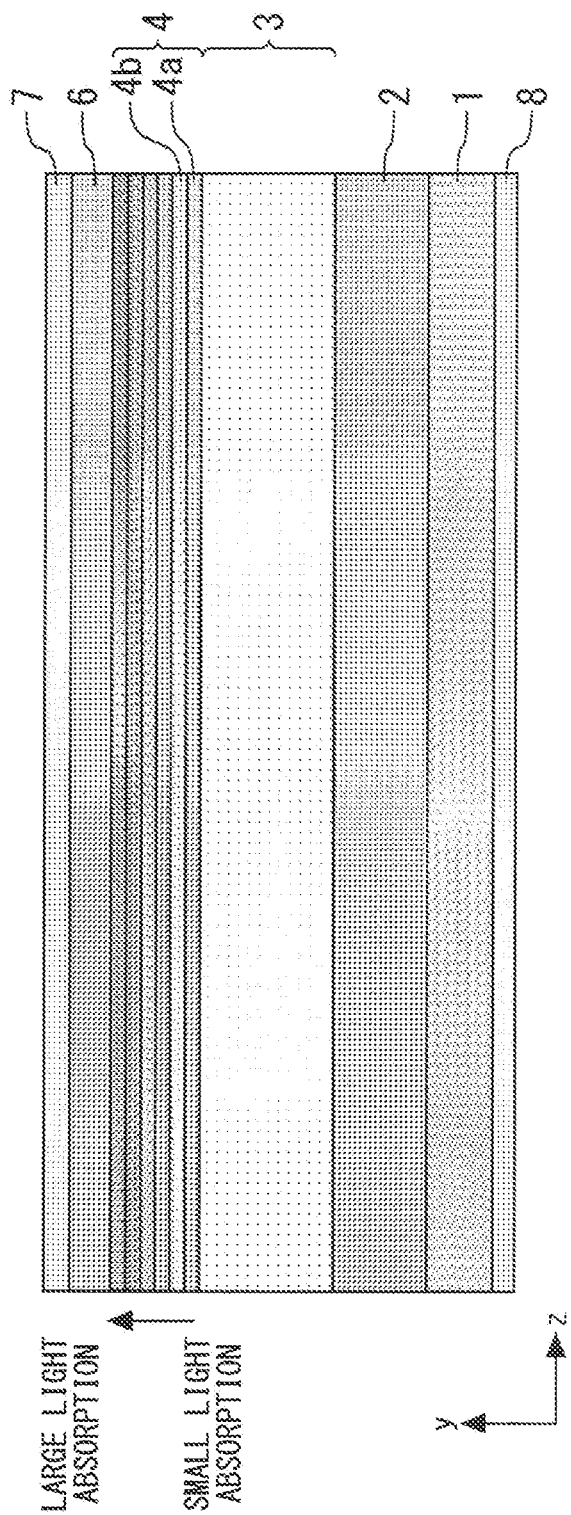

EDGE-EMITTING SEMICONDUCTOR LASER

BACKGROUND OF THE INVENTION

Field

The present invention relates to an edge-emitting semiconductor laser which emits light from a waveguide facet.

Background

In a semiconductor laser, a core layer of a high refractive index including an active layer is sandwiched between cladding layers of a low refractive index provided above and below the core layer so as to form a waveguide. One of the cladding layers between which the active layer is sandwiched is doped to be p-type while the other cladding layer is doped to be n-type. Holes injected from the p-type cladding layer side and electrons injected from the n-type cladding layer side recombine to emit light in the active layer. Part of the light produced from the active layer is totally reflected at the interface between the core layer and the cladding layer to return into the active layer. The light is given a gain and amplified during passage through the active layer and is totally reflected again at the interface between the core layer and the cladding layer. The light propagates through the waveguide and amplifies by repeating this process.

The interface between a semiconductor laser facet and air which is an emergence medium acts as a reflecting mirror, and the reflecting mirrors at the front and rear facets form a Fabry-Perot resonator. Part of light having propagated through the waveguide exits to the outside through one of the semiconductor facets, thereby causing a mirror loss. The other part of the light is reflected by the facet to again propagate in the waveguide. While these actions are repeating, only a particular wavelength of light having a standing wave in the resonator resonates. When the sum of the internal loss during propagation in the waveguide and the mirror loss at the time of facet reflection and the gain obtained during propagation become equal to each other, the laser oscillates to emit coherent light from the facet.

Light is guided and propagated while being repeatedly reflected totally at the interfaces between the core layer having a high refractive index and the cladding layers having a low refractive index. Because the reflectance at each interface has no wavelength dependence, the waveguide itself has no wavelength selectivity. When a change in temperature occurs, the lasing wavelength is shifted by a change in bandgap of the active layer. At this time, therefore, the lasing wavelength of the laser deviates largely from the desired wavelength, e.g., a wavelength of 1310 nm, at which the wavelength dispersion in an optical fiber is zero. There is a problem that the distance through which an optical signal is transmitted is limited under the influence of this dispersion.

As a conventional art for solving this problem, a distributed feedback laser (DFB-LD) having a diffraction grating provided along the waveguide and a distributed-reflector laser (DBR-LD) are known. These lasers, however, have complicated structures such that processing on the order of submicrons at the time of manufacturing of the device is required, resulting in reductions in productivity and yield.

A semiconductor laser has also been proposed which is provided with a semiconductor multi-layer reflection layer in which two types of compound semiconductor layers each having a thickness of about $\lambda/4n$ where $\lambda$ is the lasing wavelength and n is the refractive index of the medium are alternately laid one on another (see, for example, JP 7-202320 A). This thickness, however, is not a thickness set by considering the angle of incidence on the semiconductor multi-layer reflection layer of light propagating in the core.

SUMMARY

In view of the above-described problems, an object of the present invention s to provide an edge-emitting semiconductor laser capable of inhibiting deviation of the lasing wavelength accompanying a change in temperature without reducing the productivity and yield.

According to the present invention, an edge-emitting semiconductor laser includes: a semiconductor substrate; a first cladding layer having a first refractive index and formed on the semiconductor substrate; an active layer formed on the first cladding layer and having a second refractive index higher than the first refractive index; a Bragg reflector formed on the active layer and in which low-refractive-index layers and high-refractive-index layers each having a thickness larger than $\lambda/4n$ are alternately laid one on another where $\lambda$ is an lasing wavelength and n is a refractive index of a medium; a light absorption layer formed on the Bragg reflector and having bandgap energy lower than that of the active layer; and a second cladding layer formed on the light absorption layer and having a third refractive index lower than the second refractive index.

In the present invention, the Bragg reflector in which the low-refractive-index layers and the high-refractive-index layers each having a thickness larger than $\lambda/4n$ are alternately laid one on another is provided between the active layer and the light absorption layer. A deviation of the lasing wavelength accompanying a change in temperature can thereby be inhibited without reducing the productivity and yield.

Other and further objects, features and advantages of the invention will appear more fully from the following description.

BRIEF DESCRIPTION OF DRAWINGS

FIG. 9 is a sectional view of an edge-emitting semiconductor laser according to a sixth embodiment of the present invention.

DESCRIPTION OF EMBODIMENTS

An edge-emitting semiconductor laser according to the embodiments of the present invention will be described with reference to the drawings. The same components will be denoted by the same symbols, and the repeated description thereof may be omitted.

First Embodiment

Figure 1:
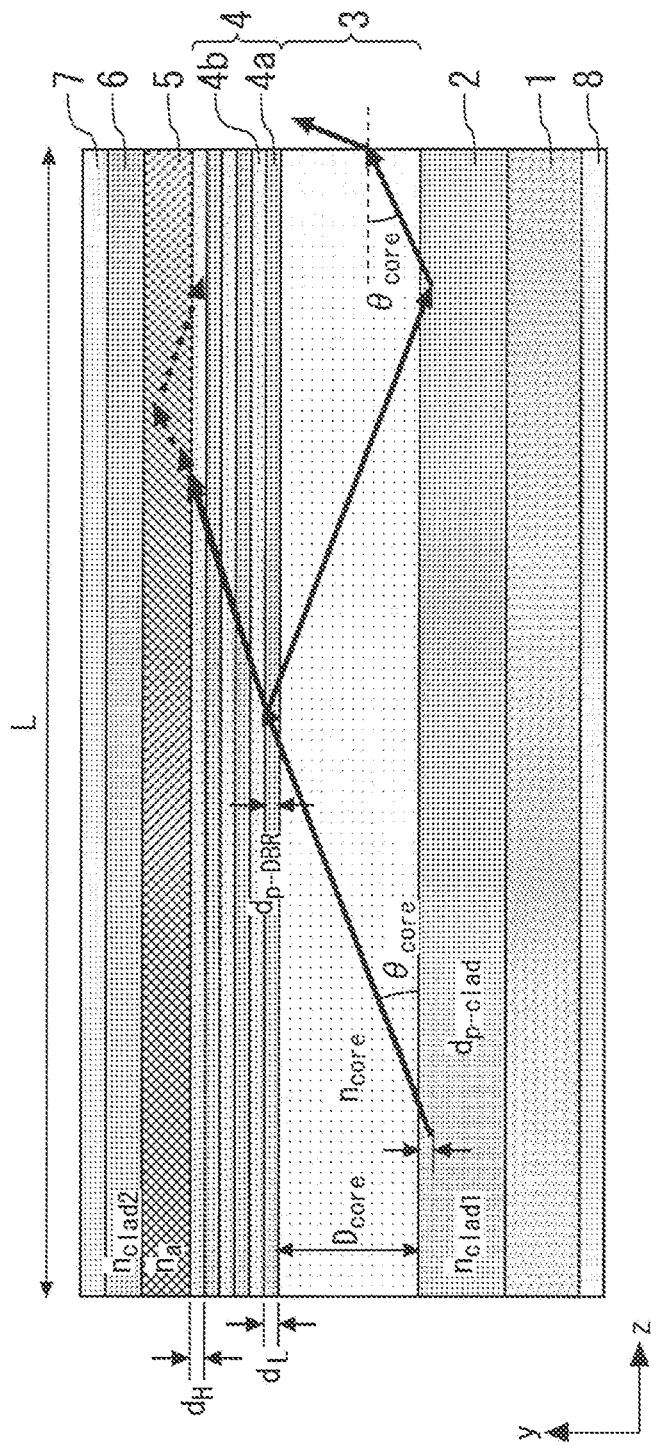
FIG. 1 is a sectional view of an edge-emitting semiconductor laser according to a first embodiment of the present invention.

FIG. 1 is a sectional view of an edge-emitting semiconductor laser according to a first embodiment of the present invention. A first cladding layer 2 having a first refractive index $n_{clad1}$ and formed of InP is fainted on an InP substrate 1. An active layer 3 having a second refractive index $n_{core}$ higher than the first refractive index $n_{clad1}$ is formed on the first cladding layer 2. The active layer 3 may be constituted of an InGaAsP-based or AlGaInAs-based semiconductor and may include a multiple quantum well layer. The thickness of the active layer 3 is $D_{core}$.

A Bragg reflector 4 (DBR) formed of an InGaAsP-based or AlGaInAs-based semiconductor is formed on the active layer 3. The Bragg reflector 4 has a periodic structure in which low-refractive-index layers 4a each having a thickness $d_L$ and a refractive index $n_L$, and high-refractive-index layers 4b each having a thickness $d_H$ and a refractive index $n_H$ are alternately superposed one on another. These refractive indices are in a relationship: $n_H > n_L$. The periodic structure of the Bragg reflector 4 starts from the low-refractive-index layers 4a at its one side near the active layer 3 and ends by reaching the high-refractive-index layer 4b at its other side.

A light absorption layer 5 having bandgap energy lower than that of the active layer 3 is formed on the Bragg reflector 4. The light absorption layer 5 is formed of an InGaAsP-based or AlGaInAs-based semiconductor. The light absorption layer 5 has a refractive index of $n_a$ and a film thickness of $d_a$. For the light absorption layer 5, a material having a bandgap Eg sufficiently smaller than the lasing wavelength, such that the light absorption coefficient is high, e.g., InGaAsP having Eg=0.886 eV when the lasing wavelength is 1310 nm is used.

A second cladding layer 6 having a third refractive index $n_{clad2}$ lower than the second refractive index $n_{core}$ and formed of InP is formed on the light absorption layer 5. An electrode 7 formed of a metal including Au, Ge, Zn, Pt or Ti is formed on the second cladding layer 6. An electrode 8 formed of a metal including Au, Ge, Zn, Pt or Ti is formed under the InP substrate 1. A current is injected through the electrodes 7 and 8 at the top and bottom of the semiconductor layers to cause emission of light from the active layer 3.

If the InP substrate 1 is p-type, the first cladding layer 2 under the active layer 3 is doped to be p-type and each of the Bragg reflector 4, the light absorption layer 5 and the second cladding layer 6 above the active layer 3 is doped to be n-type. Conversely, if the InP substrate 1 is n-type, the first cladding layer 2 under the active layer 3 is doped to be n-type and each of the Bragg reflector 4, the light absorption layer 5 and the second cladding layer 6 above the active layer 3 is doped to be p-type.

The doping concentration in the semiconductor layers is distributed in a grading or stepping manner in each layer so as to be uniform in each layer or higher in the vicinities of the semiconductor layer interfaces, and has a value in a range from $1 \times 10^{16}$ cm$^{-3}$ to $2 \times 10^{19}$ cm$^{-3}$. The resonator length L of the device is ordinarily set to 150 to 600 μm but is not particularly limited within this range.

Light produced in the active layer 3 is guided and propagated with a propagation angle $\theta_{core}$ by being totally reflected repeatedly at the interface between the active layer 3 and the first cladding layer 2 and the interface between the active layer 3 and the Bragg reflector 4. Providing a wavelength dependence of the reflectance at the interface between the active layer 3 and the Bragg reflector 4 requires satisfying Expression 1 as a prerequisite such that total reflection does not occur at the interface between the active layer 3 and the low-refractive-index layer 4a of the Bragg reflector 4 while total reflection occurs at the interface between the first cladding layer 2 and the active layer 3, and also requires satisfying Expression 2 such that total reflection does not occur at the interface between the light absorption layer 5 and the high-refractive-index layer 4b of the Bragg reflector 4 while total reflection occurs at the interface between the light absorption layer 5 and the second cladding layer 6.

$$n_{clad1} \leq n_{core} \cos \theta_{core} \leq n_L \quad \text{(Expression 1)}$$

$$n_{clad2} \leq n_{core} \cos \theta_{core} \leq n_a \quad \text{(Expression 2)}$$

Further, it is necessary to satisfy Expression 3 for emission of light from the laser facet into air (refractive index 1).

$$n_{core} \sin \theta_{core} < 1 \quad \text{(Expression 3)}$$

The propagation angle $\theta_{core}$ is determined by Expression 4 where $d_{p\text{-}DBR}$ and $d_{p\text{-}clad}$ are depths in the Bragg reflector 4 and the first cladding layer 2 to which light oozes out.

$$(D_{core} + d_{p\text{-}DBR} + d_{p\text{-}clad})n_{core}\sin\theta_{core} = \frac{m\lambda}{2} \quad \text{(Expression 4)}$$

$$(m = 1, 2, 3 \ldots)$$

Enabling propagation of only a fundamental mode of light as a transverse mode requires designing the film thickness $D_{core}$ and the refractive index $n_{core}$ of the active layer 3 so that m satisfies Expression 4 only when m=1. For example, if $D_{core}$=767 nm and $n_{core}$=3.3 at a lasing wavelength $\lambda$=1310 nm, the propagation angle can be approximated at $\theta_{core}$=15°. Further, if $n_a$=3.29 and $d_a$=200 nm for the light absorption layer 5 and $n_{clad1}$=$n_{clad2}$=3.17 for the first and second cladding layers 2 and 6, Expressions 1 to 3 can be satisfied.

A wavelength dependence of the reflectance $R_{DBR}(\lambda)$ of the Bragg reflector 4 can be provided by designing the film thickness and the refractive index. In a case where light having a wavelength $\lambda$ is incident at an incident angle $\theta_i$ on the surface of the Bragg reflector 4, the reflectance at the wavelength $\lambda$ is maximized when the thicknesses $d_L$ and $d_H$ of the low-refractive-index layers and the high-refractive-index layers of the Bragg reflector 4 respectively satisfy Expressions 5 and 6. The film thicknesses $d_H$ and $d_L$ and the refractive indices $n_H$ and $n_L$ of the layers of the Bragg reflector 4 are designed so that $R_{DBR}(\lambda)$ is maximized at the desired lasing wavelength $\lambda$. For propagation of light through the core, it is necessary that $0° < \theta_i < 90°$. From Expressions 5 and 6, $d_L$ and $d_H$ have values larger than $\lambda/4n$.

$$d_L = \frac{\lambda}{4n_L \sin\theta_i} \quad \text{(Expression 5)}$$

$$d_H = \frac{\lambda}{4n_H \sin\theta_i} \quad \text{(Expression 6)}$$

For example, if the Bragg reflector 4 is formed of thirty pairs of layers having $n_H$=3.31, $n_L$=3.29, $d_H$=382 nm and $d_L$=385 nm, the maximum reflectance can be obtained at the lasing wavelength $\lambda$=1310 nm.

For oscillation of this laser, it is necessary to satisfy Expression 7, where L is the resonator length; $\Gamma$ is an optical confinement factor; g is a gain; $\alpha_i$ is an internal loss; and $R_f$ and $R_r$ are the reflectance at the front facet and the reflectance at the rear facet, respectively.

$$\Gamma_g = \alpha_i + \frac{1}{2L}\ln\left(\frac{1}{R_r R_f}\right) \quad \text{(Expression 7)}$$

While light in a wavelength band for a high reflectance is guided and propagated while being repeatedly reflected by the Bragg reflector 4, part of light produced in a wavelength band for a low reflectance passes through the Bragg reflector 4, reaches the light absorption layer 5 behind the Bragg reflector 4, and is thereafter reflected totally at the interface between the light absorption layer 5 and the first cladding layer 2 to return into the active layer 3. Absorption of light occurs during this process. Therefore the internal absorption loss $\alpha_i$ of the semiconductor laser included in Expression 7 is a function of the reflectance $R_{DBR}(\lambda)$ of the Bragg reflector 4 and has a wavelength dependence. According to Expression 7, a threshold gain $g_{th}$ necessary for laser oscillation is low at a wavelength at which the internal absorption loss $\alpha_i(\lambda)$ is small, that is, the reflectance $R_{DBR}(\lambda)$ is high. On the other hand, at a wavelength at which the internal absorption loss $\alpha_i(\lambda)$ is large, that is, the reflectance $R_{DBR}(\lambda)$ is low, the threshold gain $g_{th}$ necessary for laser oscillation is high and a high current value is required. Thus, laser oscillation occurs at a low current value at which $\alpha_i(\lambda)$ of a wavelength is small. This wavelength dependence of the internal absorption loss $\alpha_i(\lambda)$ enables the waveguide to have wavelength selectivity.

Figure 2:
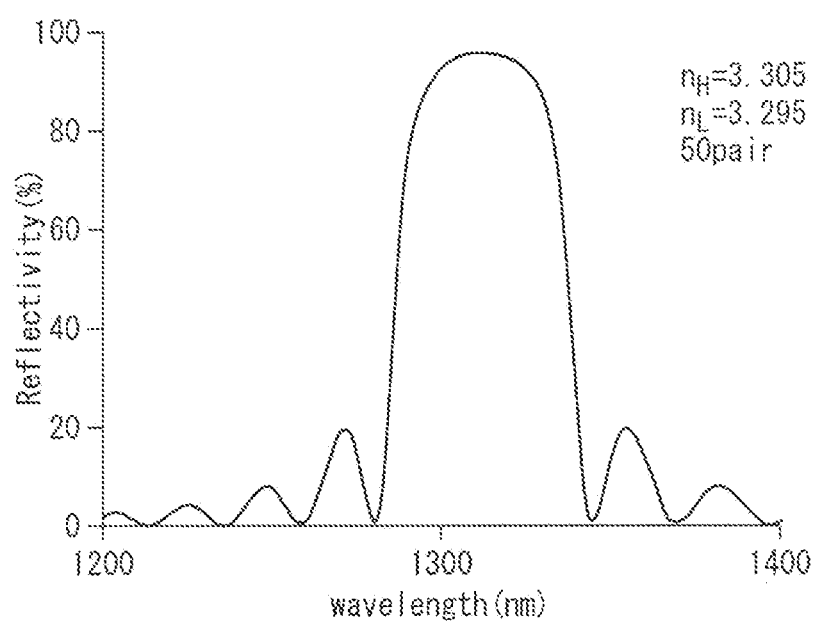
FIG. 2 is a diagram showing computed values of a reflectance spectrum when light is incident on the Bragg reflector.

FIG. 2 is a diagram showing computed values of a reflectance spectrum when light is incident on the Bragg reflector. The Bragg reflector has fifty pairs of layers having $n_H$=3.305 and $n_L$=3.295. The incident angle of light is 15°, the same as the propagation angle $\theta_{core}$ of light. The refractive index of the incidence medium was set to 3.3 corresponding to that of the active layer, and the refractive index of the emergence medium was set to 3.29 corresponding to that of the absorption layer. While a reflectance of 95.9% is obtained at the lasing wavelength 1310 nm, the reflectance lowers with deviation of the wavelength from this value.

Figure 3:
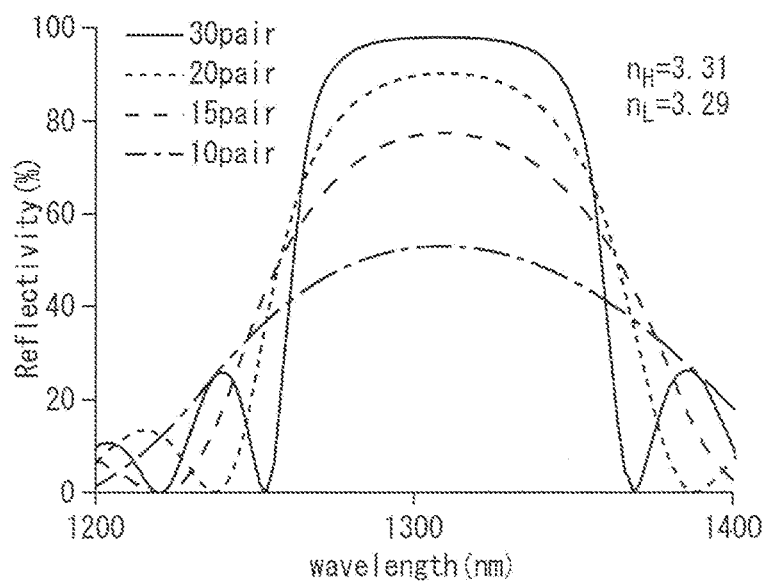
FIG. 3 is a diagram showing reflection spectrums obtained by changing the number of pairs of layers in the Bragg reflector.

FIG. 3 is a diagram showing reflection spectrums obtained by changing the number of pairs of layers in the Bragg reflector. The refractive indices are $n_H$=3.31 and $n_L$=3.29. A higher reflectance can be obtained if the number of pairs of the Bragg reflector layers is increased.

Figure 4:
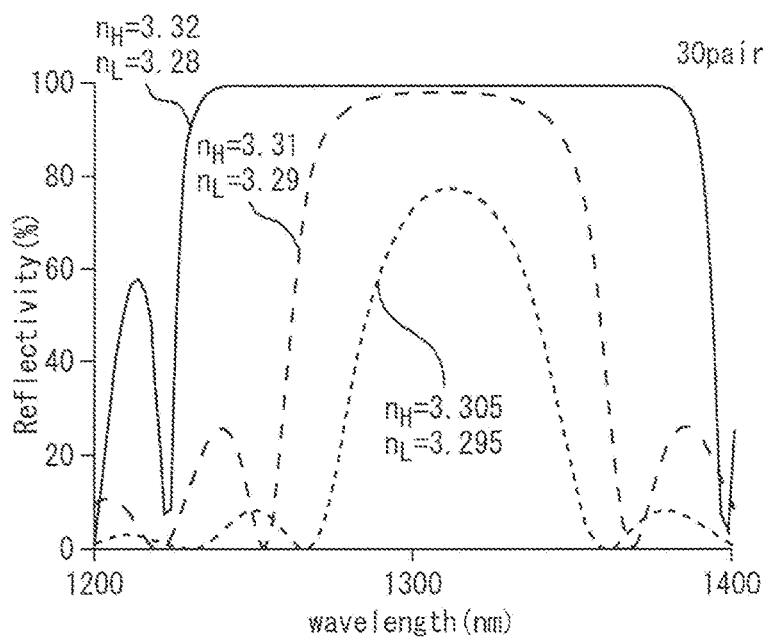
FIG. 4 is a diagram showing reflection spectrums obtained by selecting from different combinations of refractive indices for the Bragg reflector.

FIG. 4 is a diagram showing reflection spectrums obtained by selecting from different combinations of refractive indices for the Bragg reflector. The Bragg reflector has thirty pairs of layers. The combinations of refractive indices are $(n_H, n_L)$=(3.305, 3.395), (3.31, 3.29), (3.32, 3.28). The Bragg reflector has film thicknesses of $(d_H, d_L)$=(383 nm, 385 nm), (382 nm, 385 nm), (381 nm, 386 nm). The high-reflectance wavelength bandwidth is determined from the difference in refractive index between the layers constituting the Bragg reflector. If the refractive index difference is reduced, the bandwidth is reduced and higher wavelength selectivity can be provided. Consequently, even when the gain spectrum of the active layer is shifted due to a change in temperature, a deviation of the lasing wavelength can be limited by the wavelength selectivity of the waveguide.

In the present embodiment, as described above, the Bragg reflector 4 in which the low-refractive-index layers 4a and the high-refractive-index layers 4b each having a thickness larger than $\lambda/4n$ are alternately laid one on another is provided between the active layer 3 and the light absorption layer 5. A deviation of the lasing wavelength accompanying a change in temperature can thereby be inhibited without reducing the productivity and yield. The same effect can also be obtained by forming the light absorption layer 5 and the Bragg reflector 4 under the active layer 3.

Second Embodiment

Figure 5:
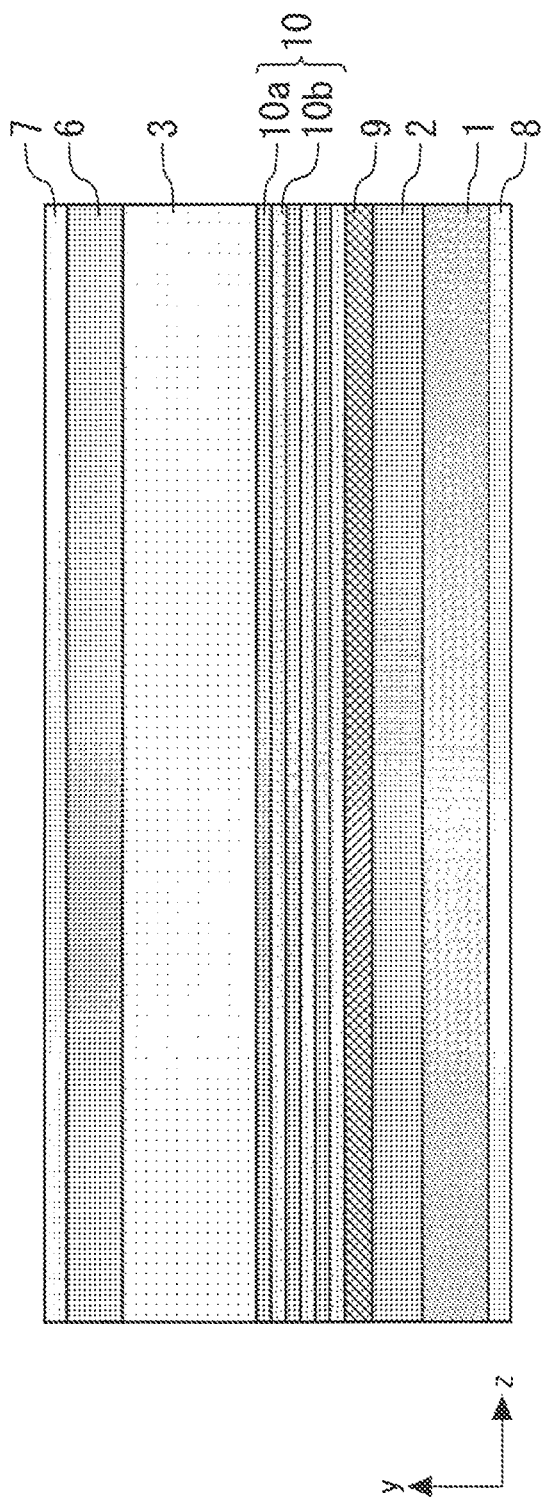
FIG. 5 is a sectional view of an edge-emitting semiconductor laser according to a second embodiment of the present invention.

FIG. 5 is a sectional view of an edge-emitting semiconductor laser according to a second embodiment of the present invention. A light absorption layer 9 is formed on the first cladding layer 2 instead of the Bragg reflector 4 and the light absorption layer 5 in the first embodiment, and a Bragg reflector 10 is formed on the light absorption layer 9. The active layer 3 is formed on the Bragg reflector 10. The Bragg reflector 10 has low-refractive-index layers 10a and high-refractive-index layers 10 each having a thickness larger than $\lambda/4n$ and alternately laid one on another, as does the Bragg reflector 4. In other respects, the arrangement is the same as that in the first embodiment. Also with the arrangement according to the present embodiment, the same effect as that in the case of the first embodiment can be obtained.

Third Embodiment

Figure 6:
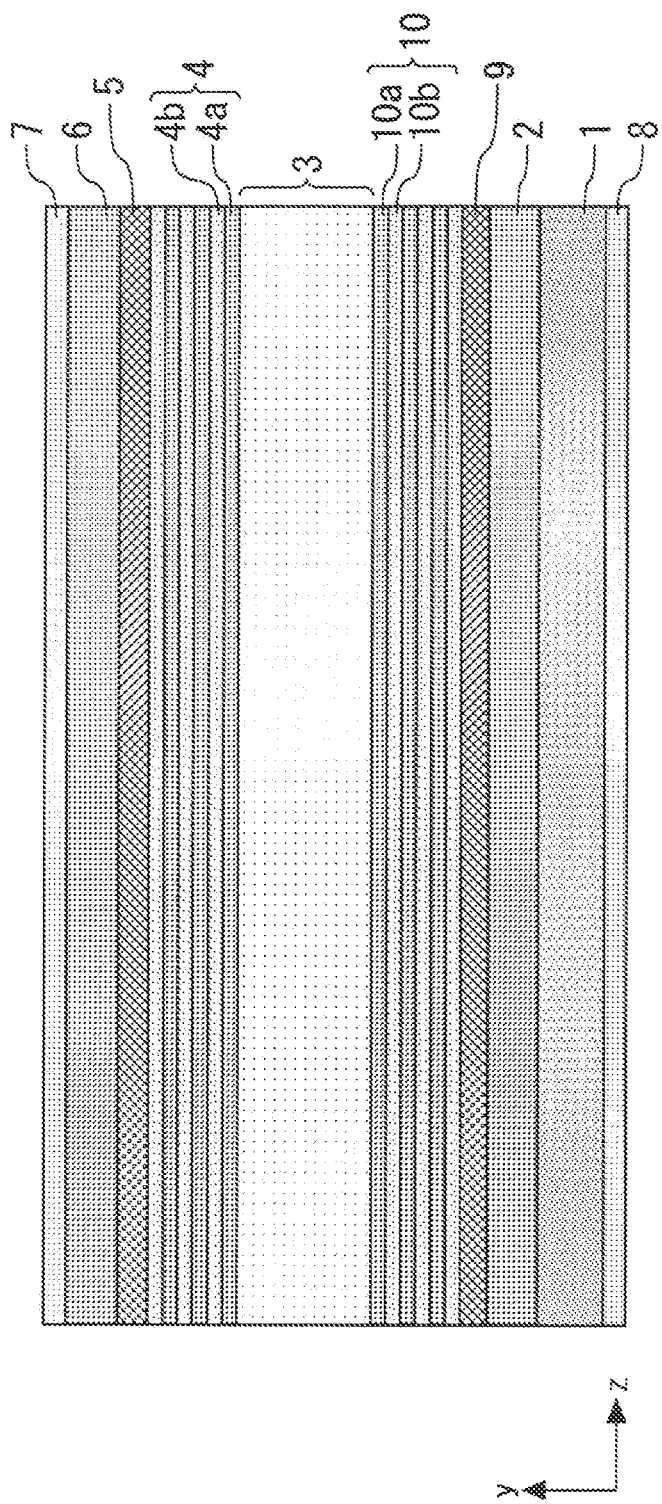
FIG. 6 is a sectional view of an edge-emitting semiconductor laser according to a third embodiment of the present invention.

FIG. 6 is a sectional view of an edge-emitting semiconductor laser according to a third embodiment of the present invention. In the third embodiment, both the Bragg reflector 4 and light absorption layer 5 in the first embodiment and the Bragg reflector 10 and light absorption layer 9 in the second embodiment are provided. By providing the absorption layers and the Bragg reflectors both on the upper side and on the lower side of the active layer 3 in this way, wavelength selectivity higher than that in the first embodiment can be obtained.

Fourth Embodiment

Figure 7:
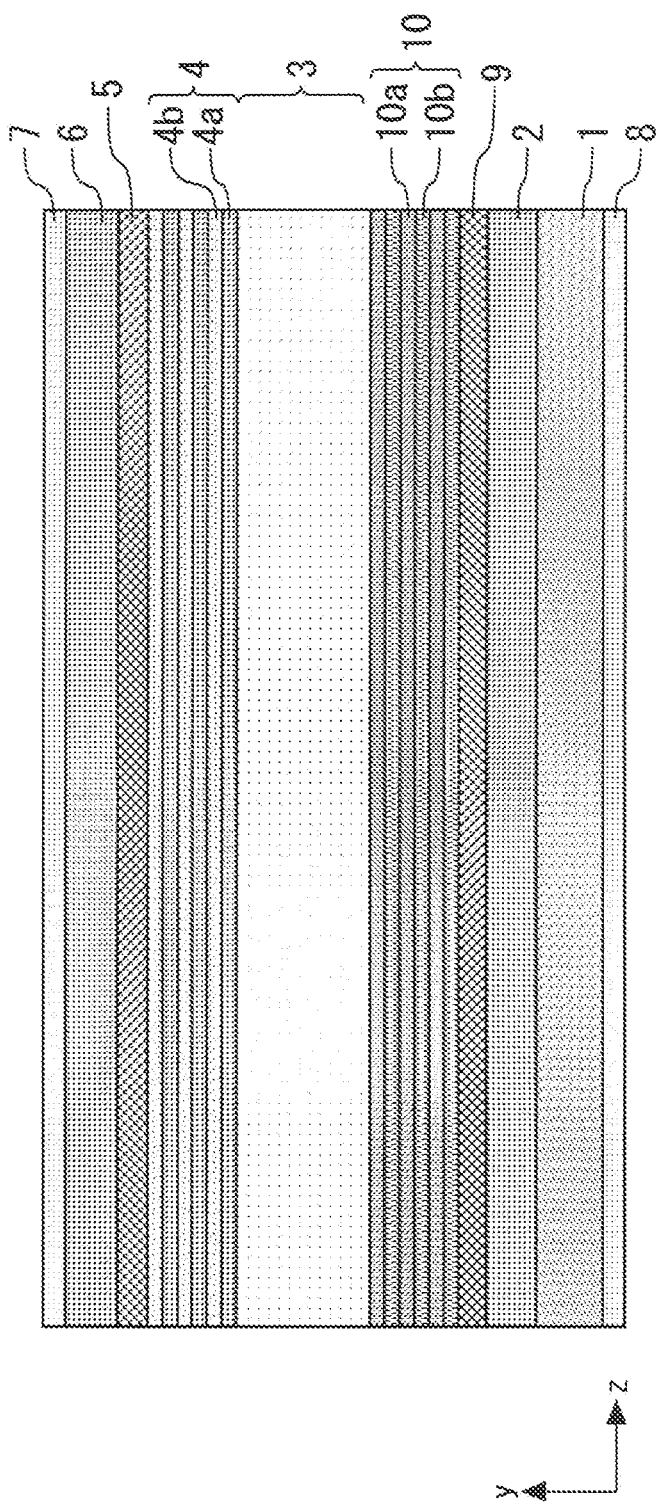
FIG. 7 is a sectional view of an edge-emitting semiconductor laser according to a fourth embodiment of the present invention.

FIG. 7 is a sectional view of an edge-emitting semiconductor laser according to a fourth embodiment of the present invention. Each of low-refractive-index layers 4a and high-refractive-index layers 4b of a second Bragg reflector 4 doped to be p-type is formed of p-type AlInGaAs with a small barrier $\Delta Ev$ on the valence band side. Each of low-refractive-index layers 10a and high-refractive-index layers 10b of a Bragg reflector 10 doped to be n-type is formed of n-type InGaAsP with a small barrier $\Delta Ec$ on the conduction band side. The barrier on the valence band side to be surmounted by holes before injection into the active layer 3 and the barrier to be surmounted by electrons before injection into the active layer 3 are thereby reduced in comparison with cases where other materials are used, thus enabling current injection to be performed with efficiency. The same effect as that in the first embodiment is also obtained. Only one of the Bragg reflectors 4 and 10 may suffice.

Fifth Embodiment

Figure 8:
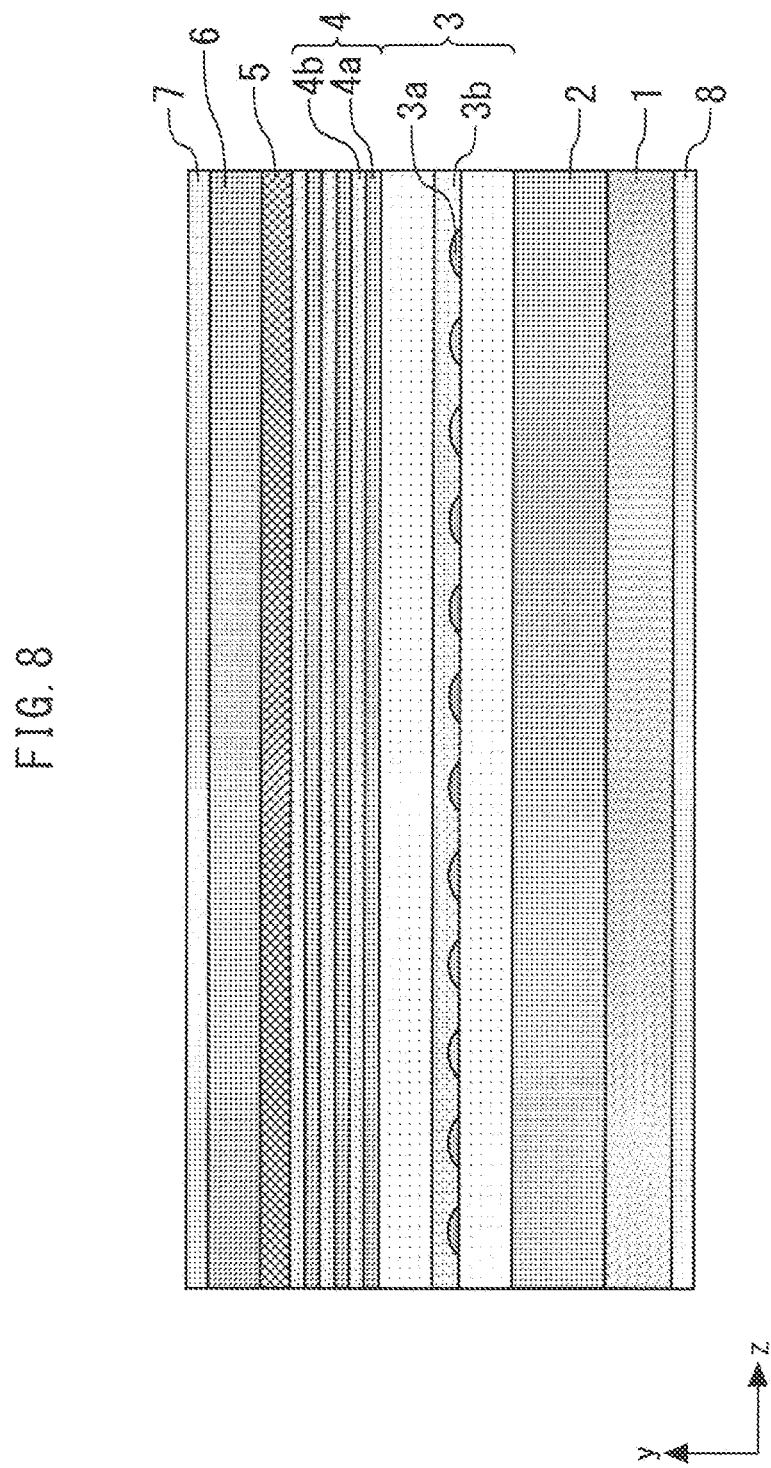
FIG. 8 is a sectional view of an edge-emitting semiconductor laser according to a fifth embodiment of the present invention.

FIG. 8 is a sectional view of an edge-emitting semiconductor laser according to a fifth embodiment of the present invention. While the active layer 3 includes a multiple quantum well layer in the first and other embodiments, the active layer 3 in the fifth embodiment has quantum dots 3*a* of an InAs-based semiconductor. The quantum dots 3*a* are embedded in a GaAs-based embedment layer 3*b* made flat. The diameter of the quantum dots 3*a* is equal to or smaller than 10 μm, Each of the materials of the first cladding layer 2, the Bragg reflector 4 and the second cladding layer 6 when the active layer 3 is formed in the above-described way is assumed to be an AlGaAs-based semiconductor. Also with the arrangement according to the present embodiment, the same effect as that in the case of the first embodiment can be obtained. The arrangement according to the present embodiment may be combined with the arrangement according to the second or third embodiment.

Sixth Embodiment

FIG. 9 is a sectional view of an edge-emitting semiconductor laser according to a sixth embodiment of the present invention. The Bragg reflector 4 is doped to have a light absorption coefficient and to also function as the light absorption layer 5. The doping concentration in the Bragg reflector 4 is changed in a grading or stepping manner such as to become lower with reduction in distance to the active layer 3 and become higher with increase in distance from the active layer 3. More specifically, the doping concentration in the Bragg reflector 4 is set as low as about $1\times10^{16}$ cm$^{-3}$ in a region close to the active layer 3 so that the lasing wavelength absorption loss is reduced, and is increased to about $2\times10^{19}$ cm$^{-3}$ with increase in distance from the active layer 3. Also with the arrangement according to the present embodiment, the same effect as that in the case of the first embodiment can be obtained. The arrangement according to the present embodiment may be combined with the arrangement according to the second, third or fourth embodiment.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2016-108916, filed on May 31, 2016 including specification, claims, drawings and summary, on which the Convention priority of the present application is based, is incorporated herein by reference in its entirety.

The invention claimed is:

1. An edge-emitting semiconductor laser comprising:
   a semiconductor substrate;
   a first cladding layer having a first refractive index and formed on the semiconductor substrate;
   an active layer formed on the first cladding layer and having a second refractive index higher than the first refractive index;
   a Bragg reflector formed on the active layer and including low-refractive-index layers and high-refractive-index layers, each of the low-refractive-index layers and each of the high-refractive-index layers having a thickness larger than $\lambda/4n$, and the low-refractive-index layers and the high-refractive-index layers are alternately laid one on another, where $\lambda$ is a lasing wavelength and $n$ is a refractive index of a medium;
   a light absorption layer formed on the Bragg reflector and having bandgap energy lower than that of the active layer; and
   a second cladding layer formed on the light absorption layer and having a third refractive index lower than the second refractive index.

2. The edge-emitting semiconductor laser according to claim 1, wherein the Bragg reflector includes an AlGaInAs layer if doped to be p-type and includes an InGaAsP layer if doped to be n-type.

3. The edge-emitting semiconductor laser according to claim 1, wherein a doping concentration in the Bragg reflector becomes lower with reduction in distance to the active layer and become higher with increase in distance from the active layer.

4. The edge-emitting semiconductor laser according to claim 1, wherein the active layer includes a multiple quantum well layer.

5. The edge-emitting semiconductor laser according to claim 1, wherein the active layer includes quantum dots.

6. An edge-emitting semiconductor laser comprising:
   a semiconductor substrate;
   a first cladding layer having a first refractive index and formed on the semiconductor substrate;
   a light absorption layer formed on the first cladding layer;
   a Bragg reflector formed on the light absorption layer and including low-refractive-index layers and high-refractive-index layers, each of the low-refractive-index layers and each of the high-refractive-index layers having a thickness larger than $\lambda/4n$, and the low-refractive-index layers and the high-refractive-index layers are alternately laid one on another, where $\lambda$ is a lasing wavelength and $n$ is a refractive index of a medium;
   an active layer formed on the Bragg reflector and having a second refractive index higher than the first refractive index and bandgap energy higher than that of the light absorption layer; and
   a second cladding layer formed on the active layer and having a third refractive index lower than the second refractive index.

7. The edge-emitting semiconductor laser according to claim 6, wherein the Bragg reflector includes an AlGaInAs layer if doped to be p-type and includes an InGaAsP layer if doped to be n-type.

8. The edge-emitting semiconductor laser according to claim 6, wherein a doping concentration in the Bragg reflector becomes lower with reduction in distance to the active layer and become higher with increase in distance from the active layer.

9. The edge-emitting semiconductor laser according to claim 6, wherein the active layer includes a multiple quantum well layer.

10. The edge-emitting semiconductor laser according to claim 6, wherein the active layer includes quantum dots.

11. An edge-emitting semiconductor laser comprising:
    a semiconductor substrate;
    a first cladding layer having a first refractive index and formed on the semiconductor substrate;
    a first light absorption layer formed on the first cladding layer;
    a first Bragg reflector formed on the first light absorption layer and including low-refractive-index layers and high-refractive-index layers, each of the low-refractive-index layers and each of the high-refractive-index layers having a thickness larger than $\lambda/4n$, and the low-refractive-index layers and the high-refractive-index layers are alternately laid one on another, where λ is a lasing wavelength and n is a refractive index of a medium;
an active layer formed on the first Bragg reflector and having a second refractive index higher than the first refractive index and bandgap energy higher than that of the first light absorption layer; and
a second Bragg reflector formed on the active layer and including low-refractive-index layers and high-refractive-index layers, each of the low-refractive-index layers and each of the high-refractive-index layers having a thickness larger than λ/4n, and the low-refractive-index layers and the high-refractive-index layers are alternately laid one on another;
a second light absorption layer formed on the second Bragg reflector and having bandgap energy lower than that of the active layer; and
a second cladding layer formed on the second light absorption layer and having a third refractive index lower than the second refractive index.

12. The edge-emitting semiconductor laser according to claim 11, wherein each of the first and second Bragg reflectors includes an AlGaInAs layer if doped to be p-type and includes an InGaAsP layer if doped to be n-type.

13. The edge-emitting semiconductor laser according to claim 11, wherein doping concentrations in the first and second Bragg reflectors become lower with reduction in distance to the active layer and become higher with increase in distance from the active layer.

14. The edge-emitting semiconductor laser according to claim 11, wherein the active layer includes a multiple quantum well layer.

15. The edge-emitting semiconductor laser according to claim 11, wherein the active layer includes quantum dots.

* * * * *